United States Patent [19]

Koch et al.

[11] Patent Number: 5,031,188

[45] Date of Patent: Jul. 9, 1991

[54] INLINE DIPLEX LIGHTWAVE TRANSCEIVER

[75] Inventors: Thomas L. Koch, Holmdel; Herwig Kogelnik, Rumson; Uziel Koren, Fair Haven, all of N.J.

[73] Assignee: AT&T Bell Laboratories, Murray Hill, N.J.

[21] Appl. No.: 516,413

[22] Filed: Apr. 30, 1990

[51] Int. Cl.$^5$ .............................................. H01S 3/19
[52] U.S. Cl. ........................................ 372/50; 372/45; 372/96; 455/607
[58] Field of Search .................... 372/50, 45, 43, 96; 455/606, 607, 609, 610-612; 370/3; 350/96.11

[56] References Cited

U.S. PATENT DOCUMENTS

| | | | |
|---|---|---|---|
| 4,730,330 | 3/1988 | Plihal et al. | 372/50 |
| 4,745,607 | 5/1988 | Koch | 372/45 |
| 4,815,081 | 3/1989 | Mahlein et al. | 372/32 |
| 4,860,294 | 8/1989 | Winzer et al. | 372/7 |
| 4,879,763 | 11/1989 | Wood | 455/607 |
| 4,899,361 | 2/1990 | Numai | 372/50 |
| 4,905,253 | 2/1990 | Chraplyvy et al. | 372/96 |
| 4,908,833 | 3/1990 | Chraplyvy et al. | 372/96 |
| 4,912,523 | 3/1990 | Refi et al. | 455/607 |
| 4,956,877 | 9/1990 | Krell et al. | 455/605 |

OTHER PUBLICATIONS

C. M. Lawson et al., Elec. Lett., vol. 20, No. 23, Nov. 8, 1984, "In—Line Single—Mode Wavelength Division ...", pp. 963-964.
R. D. Hall et al., Elec., Lett., vol. 21, No. 14, Jul. 4, 1985, "Bidirectional Transmission Over 11 km of Single ...", pp 628-629.
M. Stern et al., Elec. Lett., vol. 21, No. 20, Sep. 26, 1985, "Bidirectional LED Transmission on Single-Mode Fibre ...", pp. 928-929.
M. Kawachi et al., IGWO 1986, FDD5, "Hybrid Optical Integration with High—Silica Channel Waveguides on Silicon", pp. 62-64.
C. Cremer et al., Elec. Lett., vol. 23, No. 7, Mar. 26, 1987, "InGaAsP Y—Branch Grating Demultiplexer", pp. 321-322.
A. R. Hunwicks et al., Elec. Lett., vol. 23, No. 10, May 7, 1987, "Duplex—Diplex Optical Transmission in the 1300 nm ...", pp. 542-544.
U. Koren et al., IGWO 1989, MDD2, "Processes for Large Scale Photonic Integrated Circuits", pp. 68-71.
Y. Kanabar et al., Elec. Lett., vol. 25, No. 13, Jun. 22, 1989, "Demonstration of Novel Optical Multichannel ...", pp. 817-819.
F. Hernandez—Gil et al., Elec. Lett., vol. 25, No. 19, Sep. 14, 1989, "Tunable MQW—DBR Laser with Monolithically ...", pp. 1271-1272.
T. L. Koch et al., Elec. Lett., vol. 25, No. 24, Nov. 23, 1989, "GaInAs/GaInAsP Multiple—Quantum—Well Integrated ...", pp. 1621-1623.
R. F. Kazarinov et al., Integrated Photonics Res. Conf., Hilton Head 1990, "Four—Channel Wavelength—Division Multiplexers ...", p. 121.
C. Bornholdt et al., Integrated Photonics Res. Conf., Hilton Head 1990, "Wavelength Multiplexer/Demultiplexers Based on ...", p. 122.

*Primary Examiner*—Frank Gonzalez
*Assistant Examiner*—Galen J. Hansen
*Attorney, Agent, or Firm*—Gregory C. Ranieri

[57] ABSTRACT

Full duplex lightwave communications is achieved in a diplex transceiver realized in a semiconductor photonic integrated circuit having an inline interconnecting waveguide integral with the transmitting and receiving portions of the transceiver. Semiconductor lasers and detectors operating in different wavelength regimes permit diplex or wavelength-division-multiplexed operation. In the transceiver, lightwave signals from the laser propagate through the laser without interfering with the laser operation or the lightwave signals being generated.

8 Claims, 3 Drawing Sheets

INLINE DIPLEX LIGHTWAVE TRANSCEIVER

CROSS REFERENCE TO RELATED APPLICATION

This application is related to co-pending and commonly assigned U.S. patent application Ser. No. 07/517,103, still pending, filed on even date herewith.

TECHNICAL FIELD

This invention relates to semiconductor devices and, more particularly, to devices employed as transmitters and receivers in lightwave communication systems.

BACKGROUND OF THE INVENTION

Wavelength-division-multiplexing (WDM) affords bidirectional communications and multiple channel communications over a single optical fiber link in a lightwave communication system. For an exemplary bidirectional system between two end stations, each station transmits at an assigned wavelength. See, for example, Elect. Lett., Vol. 21, No. 20, pp. 928-9(1985). In order to receive signals from the remote end station, the receiver must operate at a wavelength different from the assigned transmitter wavelength. Separate waveguides connect the transmitter and the receiver to the optical fiber. Wavelength blocking filters and wavelength selective or routing couplers have been used to direct lightwave signals from the optical fiber to the receiver and from transmitter to the optical fiber.

By employing WDM, it is possible to design around crosstalk between signals of significantly differing strengths, namely, the high optical power signal from the transmitter and the relatively low optical power signal to the receiver. Unfortunately, receiver interference is caused by near end crosstalk from Fresnel reflections and Rayleigh backscattering of lightwave signals from the optical fiber. Receiver interference degrades receiver sensitivity and impairs WDM system performance. While WDM techniques offer the potential for bidirectional transmission on a single optical fiber, it is clear that realization of a WDM system is costly and architecturally complex. Both cost and complexity combine to make these techniques unattractive for communication systems having a large number of stations such as local area networks and "fiber to the home" applications.

SUMMARY OF THE INVENTION

Full duplex lightwave communications is achieved in a diplex transmitter realized in a semiconductor photonic integrated circuit having an inline interconnecting waveguide integral with the transmitting and receiving portions of the transceiver. Semiconductor lasers and detectors operating in different wavelength regimes permit diplex or wavelength-division-multiplexed operation. In the transceiver, lightwave signals from the laser propagate through the detector without interfering with the detector operation or the lightwave signals being detected.

In one exemplary embodiment, a shorter wavelength laser or source is integrated with a longer wavelength detector. The shorter wavelength lightwave signals of the laser propagate in a direction contrary to the longer wavelength signals for the detector in the region of the laser without affecting laser operation. This permits outgoing signals to be transmitted from the same end (facet) of the transceiver as incoming signals are received.

BRIEF DESCRIPTION OF THE DRAWING

A more complete understanding of the invention may be obtained by reading the following description of a specific illustrative embodiment of the invention in conjunction with the appended drawing in which.

It should be noted that the drawings have not been drawn to scale in order to achieve more clarity and understanding with respect to the features of the present invention.

DETAILED DESCRIPTION

Figure 1:
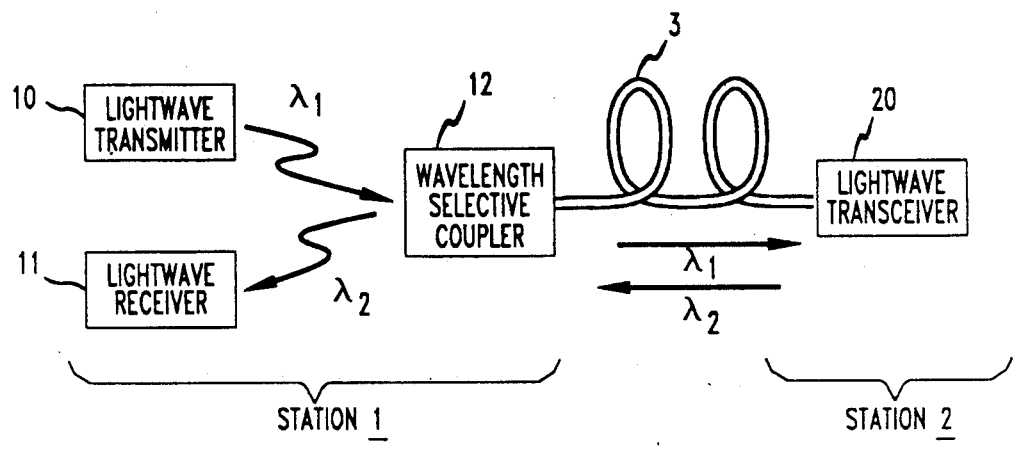
FIG. 1 shows a simplified block diagram of a wavelength-division-multiplexed lightwave communication system realized in accordance with the principles of the present invention.

A bidirectional lightwave communication system having at least two end stations is shown in simplified block diagram form in FIG. 1. Each end station modulates a lightwave signal at one wavelength with data while receiving a lightwave signal from the remote end station at a different wavelength.

End station 1 comprises lightwave transmitter 10, lightwave receiver 11, and wavelength selective coupler 12. End station 2 comprises lightwave transceiver 20 which is realized in accordance with the principles of the invention as described in more detail below. End station 1 communication with end station 2 over single optical fiber 3. Bidirectional transmission over the optical fiber is achieved because the end stations are transmitting lightwave signals to each other at two mutually exclusive wavelengths, namely, $\lambda_1$ and $\lambda_2$. That is, $\lambda_1$ is not equal to $\lambda_2$. An exemplary system could be realized with $\lambda_1$ at 1.5 $\mu$m and $\lambda_2$ at 1.3 $\mu$m. The relative directions of signals at wavelengths $\lambda_1$ and $\lambda_2$ are shown by directed arrows under optical fiber 3.

Wavelength selective coupler 12 is employed to direct the lightwave signal received on optical fiber 3 from transreceiver 20 at wavelength $\lambda_2$ to lightwave receiver 11. Also, wavelength selective coupler 12 serves as an interface for lightwave signals at wavelength $\lambda_1$ from lightwave transmitter 10 to optical fiber 3.

In accordance with the principals of invention, lightwave transreceiver 20 is realized as a photonic integrated circuit in which the lightwave transmitter and lightwave receiver are individually integrated in an inline geometry with a single waveguide. The single waveguide supports propagation of lightwave signals at wavelengths $\lambda_1$ and $\lambda_2$. For the exemplary embodiments shown below, $\lambda_1$ is chosen to be a longer wavelength than $\lambda_2$. It should be clear from the description provided below especially with reference to FIGS. 2, 3, and 4 that lightwave signals at both wavelengths counter propagate through the waveguide at least in the region associated with the lightwave transmitter shown as a 1.3 μm laser. In the FIGs. cited above, the shorter wavelength lightwave transmitter is shown as a 1.3 μm laser. In general, lightwave signals enter through an emanate from one and only one end of the waveguide in the photonic integrated circuit comprising lightwave transceiver 20.

In the various embodiments described herein, the photonic integrated transceiver circuit incorporates all the processing simplicity of a single laser, and puts all the optics needed at one end station of a $\lambda_1/\lambda_2$ bidirectional link onto a single chip with a single waveguide fiber coupling port. A complementary transceiver (1.5 μm laser integrated with a 1.3 μm detector) has successfully operated in 200 Mb/s bidirectional lightwave communications link with only a ~1 dB crosstalk penalty and sufficient margin for transmission over more than 30 km using only 50 Ω amplifiers connected directly to the detector portions of the transceivers.

Figure 2:
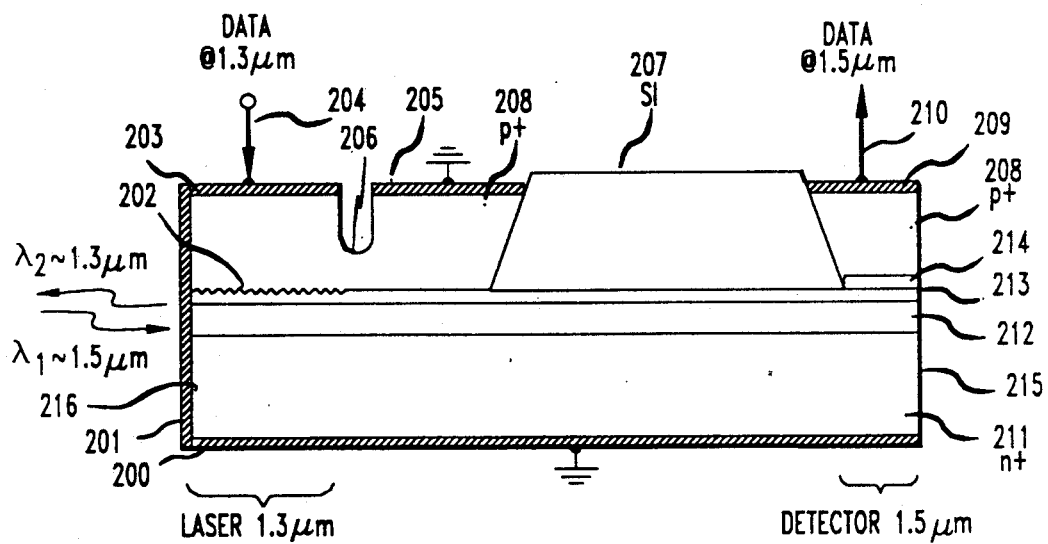
FIGS. 2 and 4 show cross-sectional views of exemplary semiconductor heterostructure arrangements for realizing the inline diplex lightwave transceiver in accordance with the principles of the present invention.

A basic exemplary design for lightwave transceiver 20 is shown FIG. 2. This embodiment includes a shorter wavelength laser and a longer wavelength detector. In order to achieve the desired transmit and receive functions for this transceiver, material absorption properties are utilized by a judicious arrangement of different semiconductor materials to form the single waveguide underlying and integrated with the transmit and receive devices. This is contrast to prior art technologies in which different wavelength signals were separated onto physically separate waveguides by interferometric or grating-based wavelength routing techniques.

Conventional semiconductor heterostructure growth techniques are employed to form the photonic integrated circuit shown in FIG. 2 as well as those shown in the subsequent figures. One such technique is described in U.S. patent application Ser. No. 237,251, still pending, filed Aug. 26, 1988. The teachings of this application are expressly incorporated herein by reference. This technique has also been described in the following technical article: *Technical Digest of the Topical Meeting on Integrated and Guided Wave Optics*, paper MDD2 (1989).

A complementary photonic integrated transceiver circuit to that shown in our copending application cross-referenced above is made in a similar in-line fashion using the principles of properly sequenced bandgap discrimination. One embodiment is shown in FIG. 2. The exemplary transmitter is a short wavelength ($\lambda_1 \sim 1.3$ μm) DFB laser which is shown with a grating above the inline waveguide layer 212. Alternative DFB structures are contemplated wherein the a grating is placed below the waveguide Gratings in such devices are typically not placed directly in the active gain layer but rather are placed in an intermediate bandgap cladding layer such as layer 213.

The active layer in this circuit is the thicker portion of the waveguide, namely, layer 212. This layer also serves as the passive guide for the incoming lightwave signal at the longer wavelength $\lambda_1$ (1.5 μm). In this phototonic integrated circuit, the longer wavelength lightwave signal at $\lambda_1$ (1.5 μm), which is the received signal, traverses the operating shorter wavelength ($\lambda_2 \sim 1.3$ μm transmit laser. Rather than being a 1.3 μm core guide, the waveguide could of course be a more complex guide containing a predominantly 1.1 μm quaternary material core. For the detector, a layer of 1.5 μm absorbing material is retained on top of the waveguide stack at the right hand end to serve as a 1.5 μm waveguide photodetector. In order to prevent any shorter wavelength 1.3 μm transmitter light from reaching the longer wavelength 1.5 μm detector where the shorter wavelength signals would indeed be detected), a separately contacted short wavelength (1.3 μm) absorber region is placed between the 1.3 μm transmitter and the 1.5 μm detector. This absorbing region is the region including and beneath contact 205. As a result, any 1.3 μm lightwave signals emitted to the right in this photonic integrated circuit is strongly before reaching the next longitudinal portion of the photonic integrated transceiver circuit containing the long wavelength (1.5 μm) absorbing layer. The short wavelength (1.3 μm) absorber region can be, for example, identical in vertical structure to the laser region. In contrast to the laser region, the short wavelength absorbing region is not pumped in order to be strongly absorbing to lightwave signals at the 1.3 μm laser wavelength. Long wavelength (1.5 μm) received lightwave signals pass without loss through the absorber region. It is preferred that the absorber region be properly electrically terminated to avoid any bleaching or punch-through into the long wavelength (1.5 μm) detector. In fact, the absorber region is capable of functioning as a back-face monitor for the short wavelength (1.3 μm) transmitter laser.

For the case of a short wavelength ($\lambda_1 \sim 1.3$ μm) DFB laser as shown in FIG. 2, end facet 216 is preferably anti-reflection coated. Anti-reflection coating is shown as layer 201. Upon passing though the operating 1.3 μm transmitter laser, the incoming 1.5 μm received signal is attenuated only by modest free-carrier and intervalence band absorption which do not create electron-hole pairs and thus do not interfere with the operation of the laser. Electrical isolation can be achieved by a number of techniques. A high performance isolation is achieved using semi-insulating InP (FE or TI doped) regrowth methods which are accomplished using processing sequences such as those referenced above.

The semiconductor heterostructure shown in FIG. 2 comprises a plurality of layers wherein substrate and lower cladding layer 211 is an n+ InP layer having a thickness of ~1.35 μm and a dopant concentration of approximately $10^{18}$ cm$^{-3}$; inline waveguide layer 212 is a substantially undoped InGaAsP having a thickness of ~0.3 μm and a set of mode fractions x and y (In$_{1-x}$Ga$_x$As$_y$P$_{1-y}$) suitable for achieving a photoluminescence peak substantially at the shorter wavelength $\lambda_2$ such as, for example, 1.3μ; intermediate waveguide and gain layer 213 in the laser section is a substantially undoped InGaAsP layer having a thickness of ~0.1 μm and a set of mole fractions suitable for achieving a photoluminescence peak substantially shorter than wavelength $\lambda_2$, for example, 1.1 μm; absorbing waveguide layer 214 is a substantially undoped InGaAsP layer having a thickness of ~0.15 μm and a set of mole fractions suitable for achieving a photoluminescence peak substantially at the longer wavelength $\lambda_1$; upper cladding layer 208 is a p+ InP layer having a thickness of ~1.5 μm and a dopant concentration of approximately $5 \times 10^{17}$ cm$^{-3}$; and electrical isolation layer 206 includes semi-insulating InP to a sufficient thickness for achieving electrical isolation between the laser/absorbing regions and the detector. It is understood that each cladding layer comprises material having a lower refractive index than the inline waveguide layer in order to form a low loss optical waveguide.

In the laser portion of the transceiver, electrical connection is made through contacts 203 and 200; in the detector portion of the transceiver, electrical connection is made through contacts 209 and 200; and in the absorbing region electrical contact is made through contacts 205 and 200. Standard metallic contacts are contemplated for use in this device. Conventional photolithographic masking and contact deposition techniques are employed to form contacts 200, 205, 203, and 209. Signals for the shorter wavelength laser are applied to the laser via lead 204. Signals from the longer wavelength detector are received via lead 210. While data signals are depicted in the FIGs., it is understood that analog and digital signals, either separately or in combination, are anticipated for use with the present invention.

The laser cavity is defined in the present embodiment by the diffraction grating 202. End facets 215 and 216 delimit the transceiver circuit. While end facet 216 may be uncoated or passivated, it is contemplated that the end facet may also be coated with standard metallic or dielectric coatings to increase or decrease the reflectivity from end facet 216.

Groove 206 is formed in the upper cladding layer to provide electrical isolation for the contact 203 and termination for the gain region for the laser. This groove is formed by various methods such as wet etching or reactive ion beam processing.

Electrical isolation between transmitter contact 203 and detector contact 209 is desirable in a photonic integrated circuit such as this. Electrical isolation can be achieved in a number of ways such as ion implantation, or by channel etching, or by growth of a semi-insulating material layer between the laser and detector sections. In particular, this latter technique is employed without additional crystal growth steps by using a processing sequence such as the previously described in U.S. patent application Ser. No. 237,251. Semi-insulating InP (Fe or Ti doped) upper cladding layers can be formed in certain regions as shown while the same semi-insulating material growth provides lateral current blocking in certain other regions such as lateral regions around the laser. While it is important to provide materials for good electrical isolation, it is preferred to utilize materials which substantially match the refractive index properties of the upper cladding layer so that unwanted perturbations of the propagating signals are avoided along the inline waveguide.

It should be understood that, for processing simplification, layer 214 includes a thin ($\sim 200$ Å)InP stop-etch layer separating the two adjacent quaternary layers 213 and 214 to allow selective removal of the absorbing layer quaternary material by using conventional masking and material selective etching techniques.

As presently understood, the principle used in this bidirectional photonic integrated transceiver circuit is based on a fundamental property of the wide bandgap passive inline waveguide. This property is the ability of this guide to be a low loss transmitting or transparent waveguide at the shorter and longer wavelengths $\lambda_2 = 1.3$ $\mu$m and $\lambda_1 = 1.5$ $\mu$m, respectively, but, concurrently in a predetermined portion of the circuit, to be strongly absorbing for incoming signals at the longer wavelength of $\lambda_1 = 1.5$ $\mu$m. As a result, when the incoming signal is coupled into the inline waveguide from end facet 216 adjacent the laser, it is transmitted to the far end of the device for absorption and detection. The short wavelength signal from the laser is generally absorbed within a short distance L, where L is inversely proportional to the material absorption coefficient $\alpha$ at the wavelength of interest, that is, for 1.3 $\mu$m material at 1.3 $\mu$m wavelength. Typically, L is less than approximately 100 $\mu$m. Absorption constitutes the generation of electron-hole pairs across the bandgap. When the absorbing region under contact 205 is properly contacted and grounded as shown, this absorbing region will constitute a shorter wavelength (1.3 $\mu$m) waveguide absorber. At the same time that the laser is generating the stronger lightwave signal at wavelength $\lambda_1$, it experiences the lower intensity received signal at wavelength $\lambda_2$ passing directly through the inline waveguide layer integral with the laser. In accordance with the principles of the present invention, properly sequencing of materials having appropriate band edge absorption properties allows an intimate integration of lightwave transmitter and receiver functions in a simple in-line geometry without interference, wherein the transmitter and receiver are designed for different wavelength operating regimes.

Figure 3:
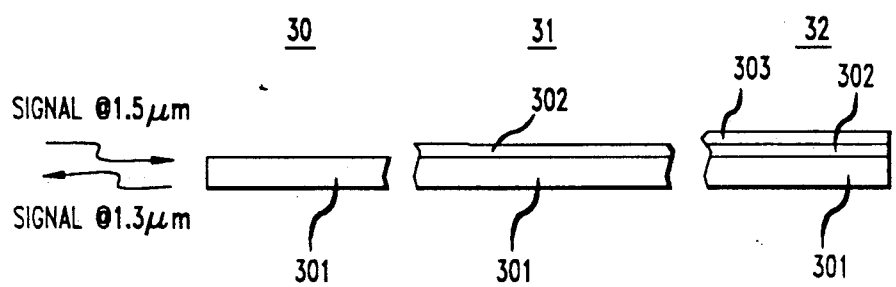
FIG. 3 shows an exemplary sequence of waveguide layers for achieving proper material bandgap absorption along the waveguide integrated in a transceiver realized in accordance with the principles of the present invention.

FIG. 3 shows a simplified view of the waveguide structure which employs bandgap discrimination in accordance with the principles of the invention. Inline waveguide layer 301 supports lightwave signal propagation of signals at wavelengths $\lambda_1$ and $\lambda_2$ throughout all portions of the photonic integrated transceiver. Gain or absorption is provided by layer 302. Absorption (detection) of the long wavelength signals is provided by layer 303. Region 30 corresponds to the passive guide region; region 31 corresponds to the active or gain section of the short wavelength laser and the absorbing region for signals therefrom; and region 32 corresponds to the detection region for the long wavelength ($\lambda_1$) lightwave signals. In this FIG., it is contemplated that the approximate photoluminescence peaks for the layer materials may be as follows: layer 301 at $\sim 1.1$ $\mu$m, layer 302 at $\sim 1.3$ $\mu$m, and layer 303 at $\sim 1.5$ $\mu$m. This layer structure is different from that shown in FIG. 2 and will be discussed further with respect to FIG. 4.

Figure 4:
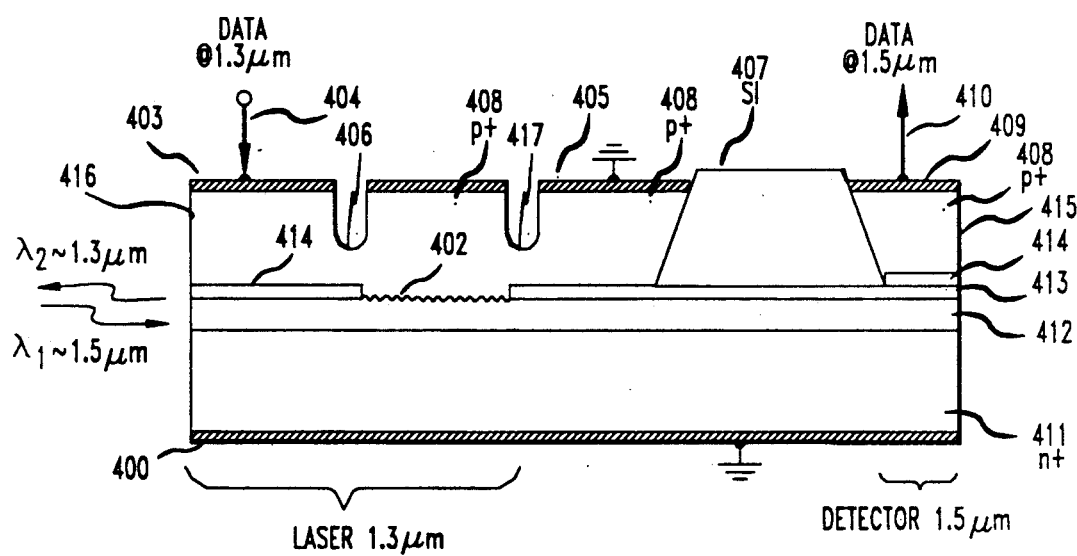
Figure 5:
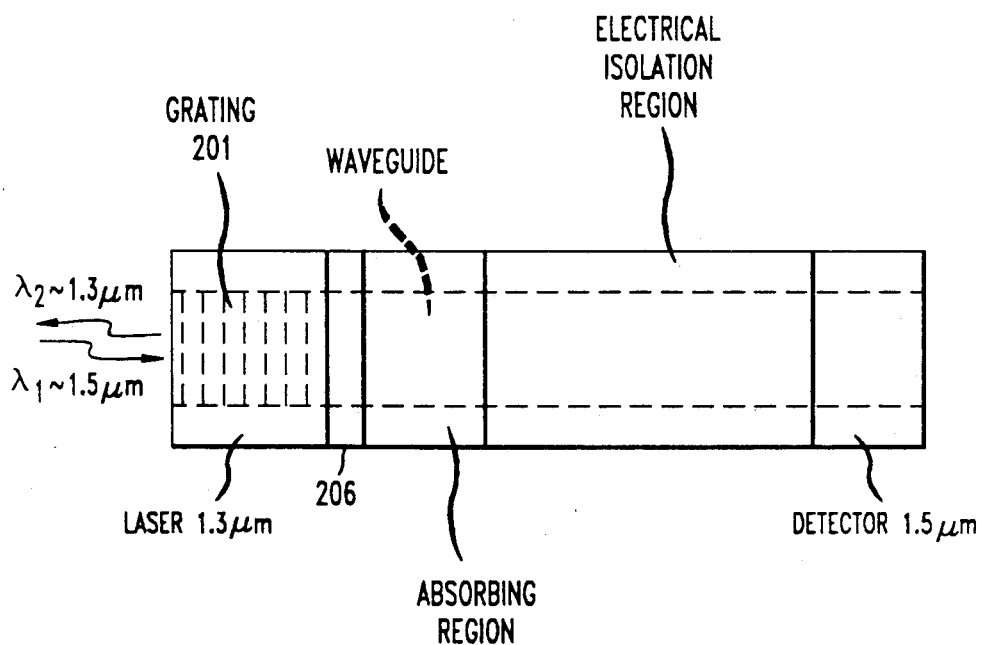
FIG. 5 is a simplified top view illustrating collinearity of the elements of the transceiver shown in FIG. 2.

While it is expected that the detector (p-i-n) structure and the distributed feedback laser structure are desirable, many different structures for the laser are contemplated. These structures include distributed Bragg reflector (DBR) lasers as shown in FIG. 4. Although not shown in the drawing. It is contemplated that the distributed Bragg reflector structure in FIG. 4 be modified to include an additional Bragg reflector in place of the end facet. Also, many of the multi-electrode and multi-section DBR and DFB laser structures are contemplated for use herein.

The laser shown in FIG. 3 is a distributed Bragg reflector laser. Diffraction grating 402 is a distributed Bragg reflector grating which is patterned on the upper surface of inline waveguide layer 412 using conventional technique such as holographic resist exposure and wet chemical etching. Placement of the grating is also contemplated to be on the upper surface of substrate and lower cladding layer 411 in the same position longitudinally as shown in the FIG. In the latter configuration, the grating is positioned beneath the inline waveguide layer. When the grating length is relatively short compared to several Bragg lengths, diffraction grating 402 is partially transmitting and permits as light to be coupled toward the detector. It is contemplated that the grating length will be sufficient to permit the grating to act as a high reflectance mirror. In this configuration, the laser injects its lightwave signal at $\lambda_2$ into the inline waveguide toward facet 416. Such an embodiment is shown in FIG. 4.

In FIG. 4, the photonic integrated transceiver employs a 1.1 μm InGaAsP layer as the inline waveguide layer. The DBR grating is placed on the 1.1 μm layer where it is substantially unpumped. Gain for the laser and absorption for the short wavelength absorbing region in the optical isolation region between the transmitter and the receiver are provided by thin 1.3 μm bulk quaternary (InGaAsP) or QW (InGaAs/InGaAsP) layer 413 residing on top of layer 412. In addition to these layers which are all passive or transparent guiding layers at 1.5 μm wavelength, another 1.5 μm absorbing layer 414 is placed on top of the others in the detector. By virtue of the optical mode overlap with the 1.5 μm absorbing layer, this region functions as a 1.5 μm waveguide photodetector.

The remaining elements shown in FIG. 4 are doped upper cladding layer 408 on p+ doped InP; doped lower cladding layer 411 of n+ InP; metallic contacts 400, 403, 405, and 409; electrical signal leads 404 and 410; and electrical isolation region 407 of semi-insulating InP. Grooves 406 and 417 provide electrical isolation between contacts for the different regions.

Although not shown in the FIGS., it is understood that lateral (transverse) confinement of the waveguides may be accomplished through standard mask and etch techniques. Typical lateral dimensions for the waveguides are approximately 0.5 μm to several μm.

Additional information concerning the multiple quantum well lasers employed in the photonic integrated transceiver circuits is found in *Electronics Letters*, Vol. 25, No. 19, pp. 1271-2 (1989).

By using bandgap discrimination in a proper sequence for each transmit/receive bidirectional wavelength-division-multiplexed end station, it has been shown how the transmitted light can actually pass through the operating detector without interference or cross-talk. By offering a simple geometry and combining all the optical devices onto a single chip with one fiber connection, photonic integrated circuits of this type should be attractive for cost-sensitive applications such as fiber to the home.

We claim:

1. A semiconductor device for transmitting a first lightwave signal at a first wavelength and for receiving a second lightwave signal at a second wavelength, said semiconductor device comprising, a waveguide for supporting propagation of said first and second lightwave signals wherein said waveguide includes a semiconductor material layer having a photoluminescence wavelength less than or equal to said first wavelength, means for generating said first lightwave signal, means for detecting said second lightwave signal from a portion of said waveguide, said first wavelength being less than said second wavelength, and means disposed between said generating means and said detecting means for absorbing said first lightwave signal, said waveguide being integral with said generating means, said absorbing means, and said detecting means, said generating means, said absorbing means, and said detecting means disposed collinearly along a longitudinal axis of said waveguide so that signals for said detecting means propagate through said generating means.

2. The semiconductor device as defined in claim 1 further comprising means for electrically isolating said generating means from said detecting means.

3. The semiconductor device as defined in claim 2 wherein the isolating means includes a body of semi-insulating semiconductor material disposed over said waveguide and between said generating means and said detecting means.

4. The semiconductor device as defined in claim 3 wherein the generating means includes a distributed feedback laser.

5. The semiconductor device as defined in claim 3 wherein the generating means includes a distributed Bragg reflector laser.

6. The semiconductor device as defined in claim 3 wherein the generating means includes a Fabry-Perot laser.

7. The semiconductor device as defined in claim 1 wherein said waveguide includes a lower cladding layer, a core waveguide layer formed on said lower cladding layer, and an upper cladding layer formed over said core waveguide layer wherein said upper and lower cladding layers provide optical confinement for the lightwave signals in the waveguide.

8. A lightwave communication system comprising at least first and second stations and means for interconnecting said stations, said first station for transmitting lightwave signals at a first wavelength and receiving lightwave signals at a second wavelength, said second station for transmitting lightwave signals at a second wavelength and receiving lightwave signals at a first wavelength, said first wavelength being less than said second wavelength, the communication system characterized in that said second station comprises a waveguide for supporting propagation of said first and second lightwave signals wherein said waveguide includes a semiconductor material layer having a photoluminescence wavelength less than or equal to said first wavelength, means for generating said first lightwave signal, means for detecting said second lightwave signal from a portion of said waveguide, and means disposed between said generating means and said detecting means for absorbing said first lightwave signal, said waveguide being integral with said generating means, said absorbing means, and said detecting means, said generating means, said absorbing means, and said detecting means disposed collinearly along a longitudinal axis of said waveguide so that signals for said detecting means propagate through said generating means.

* * * * *